(12) United States Patent
Gridelet et al.

(10) Patent No.: US 8,946,042 B2
(45) Date of Patent: Feb. 3, 2015

(54) BIPOLAR TRANSISTOR MANUFACTURING METHOD, BIPOLAR TRANSISTOR AND INTEGRATED CIRCUIT

(71) Applicant: NXP B.V., Eindhoven (NL)

(72) Inventors: Evelyne Gridelet, Omal (BE); Johannes Josephus Theodorus Marinus Donkers, Valkenswaard (NL); Tony Vanhoucke, Bierbeek (BE); Petrus Hubertus Cornelis Magnee, Malden (NL); Hans Mertens, Leuven (BE); Blandine Duriez, Brussels (BE)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/177,880

(22) Filed: Feb. 11, 2014

(65) Prior Publication Data

US 2014/0162426 A1 Jun. 12, 2014

Related U.S. Application Data

(62) Division of application No. 13/616,400, filed on Sep. 14, 2012, now Pat. No. 8,686,424.

(30) Foreign Application Priority Data

Aug. 12, 2011 (EP) .................................... 11177457

(51) Int. Cl.
*H01L 29/72* (2006.01)
*H01L 29/732* (2006.01)
(Continued)

(52) U.S. Cl.
CPC ........ *H01L 29/732* (2013.01); *H01L 29/66242* (2013.01); *H01L 29/7378* (2013.01)
USPC .......................................... 438/345

(58) Field of Classification Search
CPC ....................................................... H01L 29/732
USPC ............................................................. 438/345
See application file for complete search history.

(56) References Cited

U.S. PATENT DOCUMENTS 7,932,156 B2    4/2011    Donkers et al.
8,133,791 B2    3/2012    Hijzen et al.
(Continued)

FOREIGN PATENT DOCUMENTS

WO    03/100845 A1    12/2003
WO    2007/000683 A2    1/2007
WO    2010/006630 A1    6/2010

OTHER PUBLICATIONS

Borel, S. et al. "Control of Selectivity Between SiGe and Si in Isotropic Etching Processes", Japanese J. of Applied Physics, vol. 43, No. 6B, pp. 3964-3966 (2004).
Miyao, M. et al. "Ge fraction Dependent Improved Thermal Stability of in Situ Doped Boron in Polycrystalline $Si1\_xGex$ ($O\sim x\sim 0.5$) Films on SiON", J. of Applied Physics, vol. 97, No. 5, pp. 054909-1 to 054909-6 (2005).
(Continued)

*Primary Examiner* — Edward Wojciechowicz

(57) ABSTRACT

Disclosed is a method of manufacturing a bipolar transistor, comprising providing a substrate (10) comprising a first isolation region (12) separated from a second isolation region by an active region (11) comprising a collector impurity; forming a layer stack over said substrate, said layer stack comprising a base layer (14, 14'), a silicon capping layer (15) over said base layer and a silicon-germanium (SiGe) base contact layer (40) over said silicon capping layer; etching the SiGe base contact layer to form an emitter window (50) over the collector impurity, wherein the silicon emitter cap layer is used as etch stop layer; forming sidewall spacers (22) in the emitter window; and filling the emitter window with an emitter material (24). A bipolar transistor manufactured in accordance with this method and an IC comprising one or more of such bipolar transistors are also disclosed.

8 Claims, 4 Drawing Sheets

Figure 1:
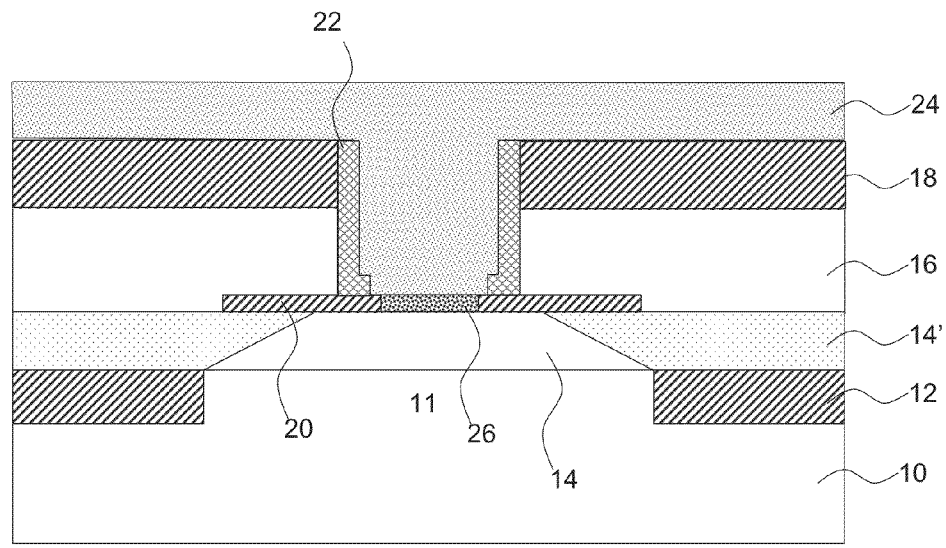

(51) Int. Cl.
*H01L 29/66* (2006.01)
*H01L 29/737* (2006.01)

(56) References Cited

U.S. PATENT DOCUMENTS

| | | |
|---|---|---|
| 2004/0195587 A1 | 10/2004 | Tsai et al. |
| 2005/0218399 A1* | 10/2005 | Magnee et al. ............... 257/19 |
| 2012/0001192 A1 | 1/2012 | Fox et al. |
| 2013/0056855 A1 | 3/2013 | Donkers et al. |

OTHER PUBLICATIONS

Caubet, V. et al. "Mechanisms ofIsotropic and Selective Etching Between SiGe and Si", J. of Vacuum Science & Technology B, vol. 24, No. 6, pp. 2748-2754 (2006).

Saarnilehto, E. et al. "Local Buried Oxide Technology for HV Transistors Integrated in CMOS", Proc. 19th Int'l. Symp. on Power Semiconductor Devices & IC's, pp. 81-84 (2007).

Extended European Search Report for EP Patent Appln. No. 11184736.4 (Mar. 19, 2012).

* cited by examiner

BIPOLAR TRANSISTOR MANUFACTURING METHOD, BIPOLAR TRANSISTOR AND INTEGRATED CIRCUIT

CROSS-REFERENCE TO RELATED APPLICATIONS

This application is a divisional of copending U.S. patent application 13/616,400, filed on Sep. 14, 2012.

FIELD OF THE INVENTION

The present invention relates to a method of manufacturing a bipolar transistor, comprising providing a substrate comprising a first isolation region separated from a second isolation region by an active region comprising a collector impurity; and forming a layer stack over said substrate, said layer stack comprising a base layer, a silicon capping layer over said base layer.

The present invention further relates to a bipolar transistor manufactured in accordance with this method.

The present invention further relates to an integrated circuit (IC) comprising one ore more of such bipolar transistors.

BACKGROUND OF THE INVENTION

Nowadays, many electronic devices incorporate functionality that operates at radio frequencies, such as mobile communication devices. The implementation of such functionality in a cost-effective manner is far from trivial. It is well-known that bipolar transistors are particularly suitable for handling signals in the radio frequency (RF) domain. However, the manufacture of integrated circuits (ICs) based on silicon bipolar transistor technology is more complex than for instance complementary metal oxide semiconductor (CMOS) ICs, and the downscaling of the device feature size is more easily achieved in CMOS technology. CMOS devices are able to achieve good RF performances but to reach performances equivalent to bipolar device, the dimensions and thus the technology node of a CMOS device has to be lower than the dimensions and thus the technology node of a bipolar device.

For a given set of specifications including the frequency range, choice has to be made between bipolar at a given node or CMOS at a lower node. Since for small volumes of production such as analog mixed signal (AMS) devices the cost of the masks is an important part of the budget and since this cost increases strongly when going to a lower node, the choice is often made in favor of bipolar and not of CMOS, or in favor of BICMOS that combines bipolar and CMOS devices in a same process flow.

For these reasons, efforts have been made to produce bipolar transistors using a CMOS process flow, thereby providing mixed technology ICs in which bipolar transistors can be used for handling RF signals. An example of such an IC is provided in WO2010/066630 A1.

The challenge that process developers face is that the number of alterations to the CMOS process should remain small whilst at the same time yielding good quality bipolar transistors that are capable of handling high frequency signals. An example of a low-complexity IC including a heterojunction bipolar transistor formed in a CMOS process flow can for instance be found in WO 2003/100845 A1.

It however remains a challenge to improve the design of bipolar transistors, and in particular bipolar transistors manufactured in CMOS manufacturing processes such that the noise of the bipolar transistor decreases and the maximum operating frequency increases, as will be explained in more detail with the aid of FIG. 1 and FIG. 2, which shows a detail of FIG. 1.

The bipolar transistor shown in FIG. 1 comprises a silicon substrate 10 including an active region 11 in which the collector of the bipolar transistor is formed, e.g. by provision of a buried layer in the substrate 10 or by implantation of an impurity into the substrate 10. The active region 11 is defined in between isolation regions 12, e.g. shallow trench isolation (STI) regions. The bipolar transistor further comprises a layer stack including an epitaxially grown base layer, which grows as a monocrystalline region 14 over the silicon substrate 10 and as a polycrystalline region 14' over the isolation regions 12. A nitride layer (not shown) may be present on the isolation regions 12. A polysilicon base contact layer 16 is present on the base layer, which is covered by an electrically insulating layer 18. An emitter window is defined over the active region 11, in which an emitter material 24 is formed, e.g. As-doped polysilicon, which is electrically insulated from the base contact layer 16 by sidewall spacers 22 in the emitter window and by the electrically insulating layer 18 for the emitter material 24 deposited outside the emitter window 28. The emitter material 24 is electrically insulated from parts of the base region 14 by the remaining portions of an etch stop layer 20, which is used to protect the underlying base layer 14 during the etching of the emitter window in the polysilicon base contact layer 16.

It has been found that a large contribution to the noise figure of the bipolar transistor of FIG. 1 originates from the extrinsic base resistance. Some relevant parts of the base resistance of the bipolar transistor of FIG. 1 are schematically depicted in FIG. 2, which shows an amplified cross-section of the bipolar transistor of FIG. 1. The main extrinsic base resistance is formed by the following components:

- the internal resistance of the SiGe in the active device (Rbi_int);
- the link resistance corresponding to the space below the spacers (Rlink);
- the link resistance corresponding to the space below the etch protect layer (Rxbm);
- the resistance of the unsilicided base poly below the emitter-poly extention (Rxbu); and
- other resistances such as the resistance between the base contact layer 16 and silicide 28 and between the silicide 28 and the base contact 30.

From these resistances, the link resistance Rxbm forms the largest contribution to the overall base resistance as in this space, the charge carriers are forced to flow in a narrow as well as long corridor corresponding to the underlying epitaxial base layer 14, which leads to a large resistance.

SUMMARY OF THE INVENTION

The present invention seeks to provide a method of manufacturing a bipolar transistor in which the base resistance can be reduced without increasing manufacturing complexity.

The present invention further seeks to provide such a bipolar transistor.

The present invention yet further seeks to provide an IC comprising one or more of such bipolar transistors.

According to an aspect of the present invention, there is provided a method of manufacturing a bipolar transistor, comprising providing a substrate comprising a first isolation region separated from a second isolation region by an active region comprising a collector impurity; forming a layer stack over said substrate, said layer stack comprising a base layer, a silicon capping layer over said base layer and a silicon-germanium base contact layer over said silicon capping layer; etching the SiGe base contact layer to form an emitter window over the collector impurity, wherein the silicon emitter cap layer is used as etch stop layer; forming sidewall spacers in the emitter window; and filling the emitter window with an emitter material.

The present invention is based on the insight that SiGe can be selectively etched compared to silicon, such that the silicon capping layer over the base layer can be used as an etch stop layer for the formation of the emitter window, such that a separate etch stop layer, which is typically made of an electrically insulating material such as $SiO_2$ or $Si_3N_4$, can be omitted from the transistor design. This has the advantage that the link resistance Rxbm is eliminated, thus improving the noise figure of the bipolar transistor. In addition, due to the fact that the base contact layer is made of a silicon-germanium alloy layer instead of the traditional polysilicon layer, a further reduction of the base resistance is achieved due to the fact that Rxbu is also reduced, which yields a further improvement of the noise figure of the bipolar transistor.

In an embodiment, the SiGe base contact layer is a polycrystalline layer, which has the advantage that it can be deposited or grown in a straightforward manner, e.g. using a vapor deposition method.

Preferably, the molar ratio of germanium in the base contact layer is higher than 0.1 (higher than 10 mole %). If the germanium content drops below 0.1 the selectivity of the etching process may not be sufficient to avoid damage to the silicon capping layer.

In an embodiment, the method further comprises terminating the etching step using an end point detector for detecting the transition between etching said base contact layer and etching said capping layer. This has the advantage that substantial damage to the silicon capping layer can be avoided in case the selectivity of the etch recipe is insufficient to prevent such damage.

The method may further comprise including an impurity into at least one of said base contact layer and said capping layer, which has the advantage that the selectivity of the etching step can be improved.

In an embodiment, the step of forming said stack further comprises forming a sacrificial silicon germanium layer over the capping layer and forming a sacrificial silicon layer over said sacrificial silicon germanium layer prior to forming the base contact layer. This has the advantage that the etch step may be performed in stages, with small steps used to remove the sacrificial layers allowing for an accurate stop of the etch process on the silicon capping layer, thus reducing the risk of damage to the capping layer.

At least one of said sacrificial layers may comprise an impurity to increase the selectivity of the etching process.

Preferably, the step of forming said base layer comprises epitaxially growing a first undoped Si layer over the substrate; an undoped SiGe:C collector-base spacer on the first undoped Si layer; a boron-doped SiGe:C base on the collector-base spacer; and a SiGe:C base-emitter spacer on the base. The base-emitter spacer may be doped or undoped. Such a base layer stack is known to improve high frequency characteristics of the bipolar transistor.

In accordance with another aspect of the present invention, there is provided a bipolar transistor comprising a substrate including a first isolation region (12) separated from a second isolation region by an active region comprising a collector region; and a layer stack over said substrate, said layer stack comprising a base layer, a silicon capping layer over said base layer and a silicon-germanium base contact layer over the silicon capping layer, the base contact layer comprising an emitter window terminating on the silicon capping layer, said emitter window being filled with an emitter material being separated from the base contact layer by sidewall spacers.

Such a bipolar transistor is characterized by the absence of a etch stop layer adjacent to the emitter between the base contact layer and the base layer and by the base contact layer being composed of a SiGe alloy, thereby yielding a bipolar transistor having an improved noise figure due to a reduced base resistance as previously explained.

In an embodiment, the emitter material comprises doped polysilicon, such as As-doped polysilicon, which has the advantage that the material is readily available in a manufacturing process such as a CMOS process.

According to yet another aspect of the present invention there is provided an integrated circuit comprising one or more bipolar transistors of the present invention. Such an integrated circuit benefits from improved operational frequencies due to the reduction in the base resistance and associated noise figure of the bipolar transistor(s).

BRIEF DESCRIPTION OF THE EMBODIMENTS

Figure 2:
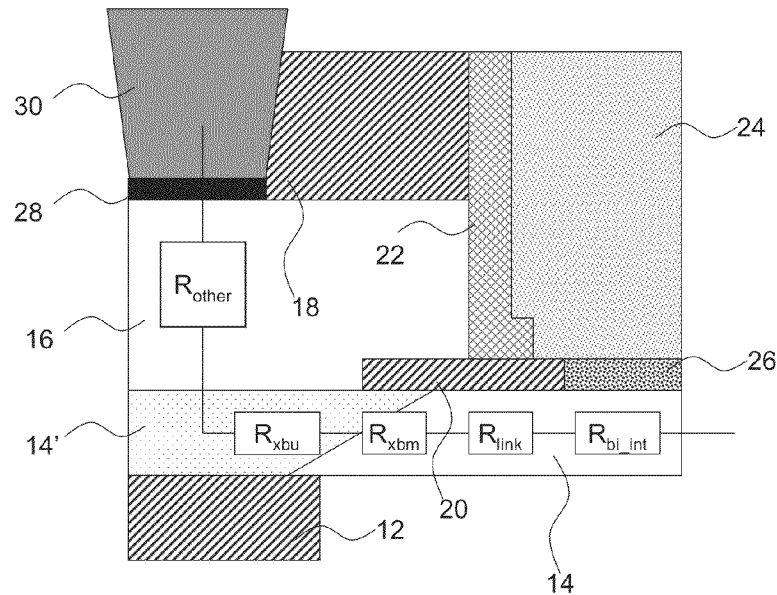
Figure 3:
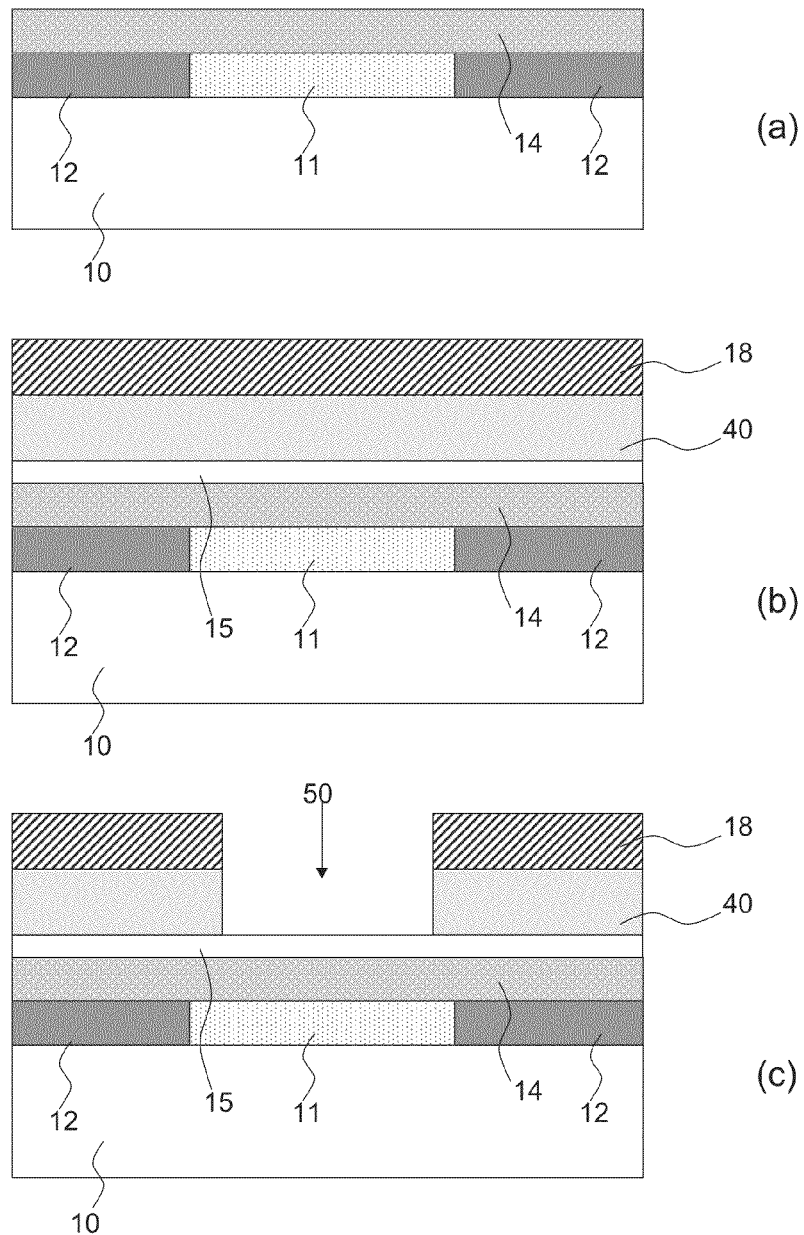
Figure 3:
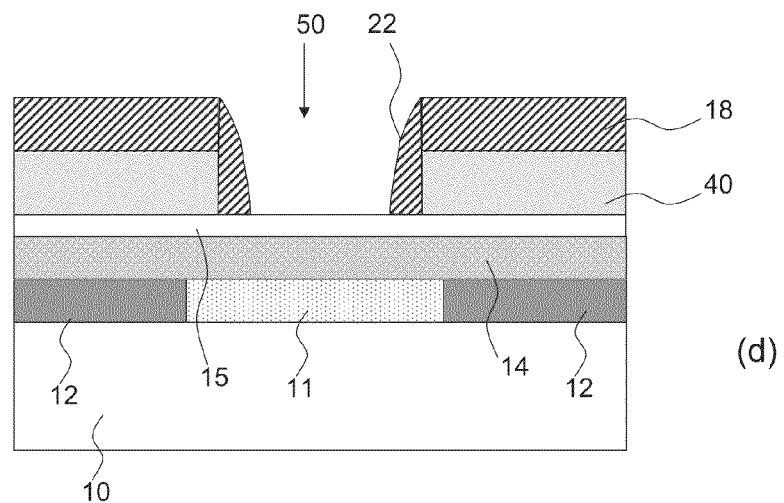
Figure 3:
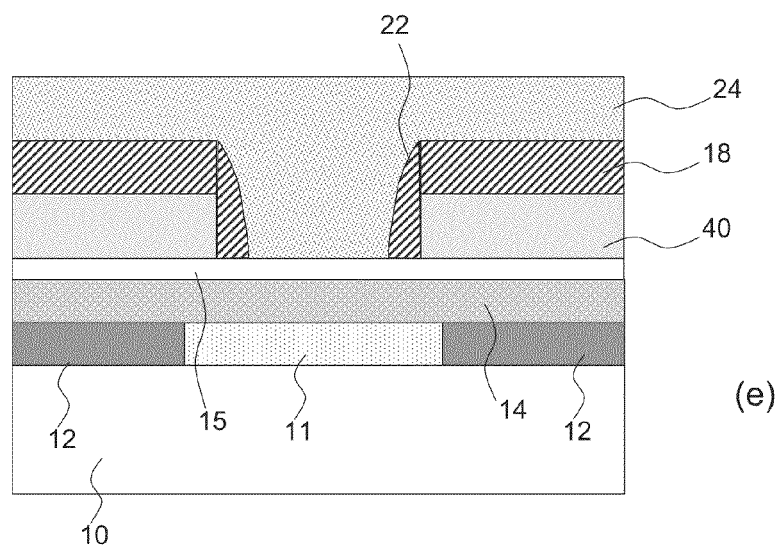
Figure 4:
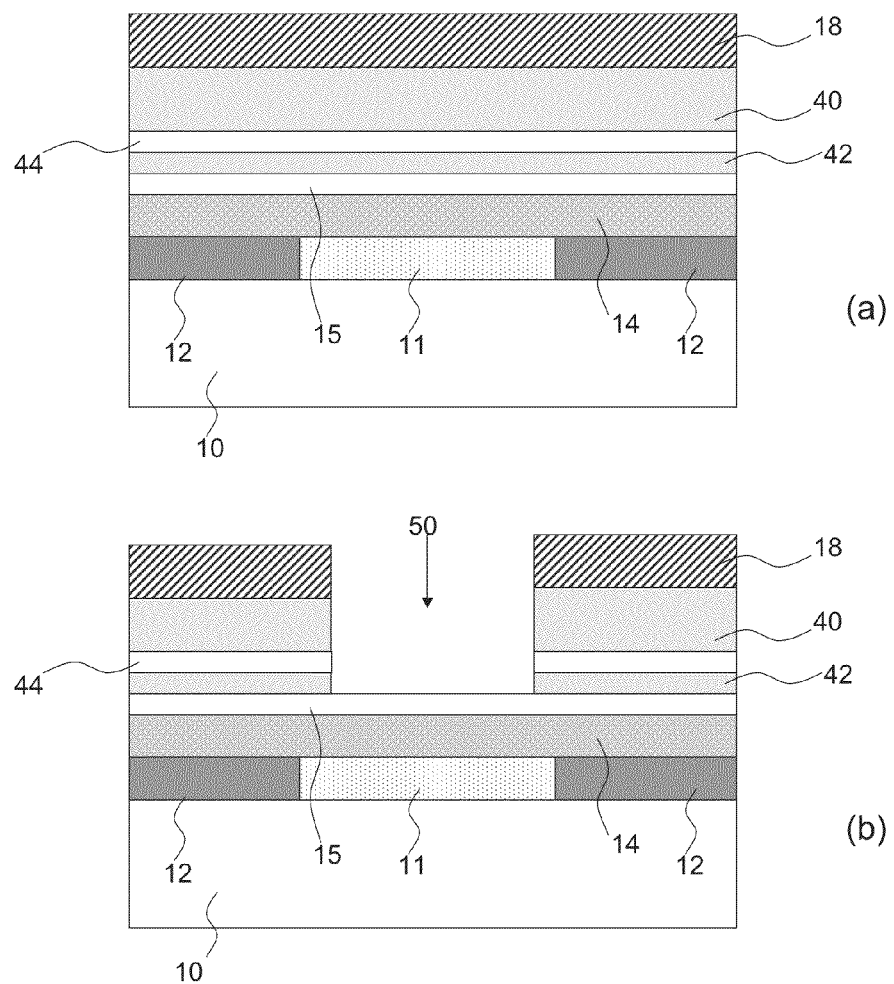

Embodiments of the invention are described in more detail and by way of non-limiting examples with reference to the accompanying drawings, wherein FIG. 1 schematically depicts a prior art bipolar transistor design;

FIG. 2 schematically depicts the various contributions to the extrinsic base resistors of the bipolar transistor design of FIG. 1;

FIG. 3 schematically depicts an embodiment of the method of the present invention; and FIG. 4 schematically depicts an aspect of an alternative embodiment of the method of the present invention.

DETAILED DESCRIPTION OF THE DRAWINGS

It should be understood that the Figures are merely schematic and are not drawn to scale. It should also be understood that the same reference numerals are used throughout the Figures to indicate the same or similar parts.

The method of the present invention may be applied to the manufacture of any suitable bipolar transistor. An embodiment of the manufacturing method of the present invention will now be explained in more detail for a particular heterojunction bipolar transistor by way of non-limiting example only. The skilled person will understand that the principles of the present invention may be applied to any bipolar transistor design that comprises a vertical layer stack in which an emitter is laterally separated from a base layer or base layer stack, as will become apparent from the following description.

A possible starting point of the method of the present invention is shown in FIG. 3. As shown in step (a), a substrate 10 including an active region 11 in between isolation regions 12 such as shallow trench isolation regions is provided. The active region typically comprises a collector region, e.g. a buried collector formed by a buried layer grown epitaxially in the substrate 10 or an implanted collector. Any suitable implementation of the collector may be contemplated. A patterned nitride layer (not shown) may optionally be formed over the isolation regions 12, whilst leaving exposed the active region 11. On this structure, a base layer 14 may be epitaxially grown, resulting in monocrystalline base layer portions growing on the exposed regions of the monocrystalline substrate 10 including the active region 11 and polycrystalline base layer portions on amorphous or polycrystalline surfaces such as the isolation regions 12 and the nitride layer if present.

In a preferred embodiment, the base layer comprises a Si/SiGe:C layer stack, which by way of non-limiting example may be formed as follows. Prior to the growth of the epitaxial base layer, the exposed silicon surfaces may be passivated by a hydrogen bake. The base layer is formed by first growing an undoped Si buffer layer, followed by the growth of an undoped SiGe:C collector-base spacer, a boron-doped SiGe:C base, a SiGe:C base-emitter spacer, which optionally may be doped, and a doped Si emitter cap. The carbon content in the SiGe layers preferably is around 0.2% and the germanium content is preferably around 20% in these layers. The carbon in the SiGe:C layers prevents the outdiffusion of boron impurities from the boron-doped base, as is known per se. However, it should be understood that the exact composition and structure of the base in the bipolar transistor of the present invention is not important; any suitable base construction may be chosen, as long as the upper layer is a silicon layer, as will be explained in more detail below. It is noted that the silicon capping layer 15 may form part of the base layer 14 or may be deposited on top of a base layer 14.

The formation of the silicon capping layer 15 is shown in step (b). After the formation the silicon capping layer 15, a silicon-germanium alloy base contact layer 40 of general formula $Si_{1-x}Ge_x$, with x preferably selected higher than 0.1, is formed directly on top of the silicon capping layer 15, i.e. without the formation of an etch stop layer over the active region 11. This has the additional advantage that the method of the present invention requires one less mask as the etch protect mask can be omitted from the mask set, thus reducing manufacturing cost.

Such a SiGe layer may be formed in any suitable manner, such as by vapor deposition. The SiGe base contact layer 40 preferably is a polycrystalline layer. A dielectric layer such as a TEOS (tetra-ethyl orthosilicate) layer 18 is subsequently formed on the SiGe base contact layer 40.

Next, as shown in step (c), the emitter window 50 is formed in the SiGe base contact layer 40 using the silicon capping layer 15 as an etch stop layer, thus obviating the need for a separate etch stop layer in the design of the bipolar transistor. The etch window for opening the emitter window 50 may be defined in any suitable manner, e.g. by forming a photoresist over the dielectric layer 18 and developing the photoresist to leave exposed the emitter window region. Such techniques are well known to the person skilled in the art and will not be explained in further detail for the sake of brevity only. It is noted that optionally an etch resist layer such as a nitride layer (not shown) may be formed over the electrically insulating layer 18 to protect this layer from etch damage during further processing steps.

A way of selectively etching SiGe with respect to silicon is for example described in the paper "Control of Selectivity between SiGe and Si in Isotropic Etching Processes" by Stephan Borel et al. in Japanese Journal of Applied Physics Vol. 43, No. 6B, 2004, pp. 3964-3966.

In order to further protect the silicon capping layer 15 from such damage, end point detection techniques may be employed as it has been found that the transition from SiGe to Si can be clearly detected by such end point detection tools. Such end point detection tools may alternatively be used in combination with etch recipes that are less or not at all selective towards SiGe as the end point detection will help prevent damage of the silicon capping layer 15.

The bipolar transistor may now be finalized using conventional techniques, such as shown in step (d), in which sidewall spacers 22 are formed inside the emitter window 50 in any suitable manner, e.g. by depositing and patterning of a dielectric layer (stack) inside the emitter window 50. For example, the sidewall spacers 22 may be silicon oxide spacers or ONO spacers.

Next as shown in step (e), an emitter material 24 is deposited on the intermediate structure resulting upon the completion of step (d). A non-limiting example of a suitable emitter material is polysilicon, which may comprise any suitable impurity, e.g. As. Thereafter, conventional patterning and contact formation steps may be performed to complete the manufacture of the bipolar transistor. Any suitable manner to complete the bipolar transistor manufacture may be chosen. As such completion steps are entirely routine to the skilled person they have not been shown for the sake of brevity only.

At this point, it is noted that the extrinsic base resistance of the bipolar transistor of the present invention is significantly reduced compared to that of the bipolar transistor of FIG. 1. The reason for this is two-fold. Firstly, as no etch stop layer portions remain present in the design of the bipolar transistor, there is no contribution to the overall extrinsic base resistance from model resistance $R_{xbm}$, as this resistance is absent in the bipolar transistor design of the present invention.

Impurities may be added to the silicon capping layer 15 and/or the SiGe base contact layer 40, e.g. boron, to improve the conductive properties of these layers and to increase the selectivity of the etch recipe. It is known per se that such impurities can affect chemical reaction rates. In fact, as the solubility of boron in polycrystalline silicon-germanium is higher than in polycrystalline silicon, it can be expected that for a base contact layer 40 doped with boron impurities a further reduction in the extrinsic base resistance is achieved.

It is not necessary for the polycrystalline silicon-germanium alloy base contact layer 40 to be formed in direct contact with the silicon capping layer 15. FIG. 4 shows an alternative embodiment of the present invention in which a first sacrificial SiGe layer 42 and a second sacrificial silicon layer 44 is formed in between the silicon capping layer 15 and the SiGe base contact layer 40. This may be used to gain better control over the etching process. For instance, a first (long) etch step may terminate on the sacrificial silicon layer 42 after which a sequence of short etch steps is employed to accurately remove the sacrificial layers 40 and 42, thus yielding the structure as shown in step (b), which may be finalized as explained in more detail with the aid of FIG. 3. The sacrificial layers may be doped with an impurity to tune the etching speed and etching selectivity.

In yet an alternative embodiment, a thin oxide layer (not shown) may be grown on the silicon capping layer 15, such a thin oxide layer is for instance used for controlling the diffusion rate of p-type dopants from the emitter material 24 into the underlying n-type silicon region. Such an oxide may for instance be used as a detection point in the end point detection of the etching of the emitter window 50.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of manufacturing a bipolar transistor, comprising:
    providing a substrate comprising a first isolation region separated from a second isolation region by an active region comprising a collector impurity;
    forming a layer stack over said substrate, said layer stack comprising a base layer, a silicon capping layer over said base layer and a silicon-germanium base contact layer over said silicon capping layer;
    etching the SiGe base contact layer to form an emitter window over the collector impurity, wherein the silicon emitter cap layer is used as etch stop layer;
    forming a sidewall spacer in the emitter window; and
    filling the emitter window with an emitter material.

2. The method of claim 1, wherein the SiGe base contact layer is a polycrystalline layer.

3. The method of claim 1, wherein a molar ratio of germanium in said base contact layer is higher than 0.1.

4. The method of claim 1, further comprising terminating the etching step using an end point detector for detecting a transition between etching said base contact layer and etching said capping layer.

5. The method of claim 1, further comprising including an impurity into at least one of said base contact layer and said capping layer.

6. The method of claim 1, wherein the step of forming said stack further comprises forming a sacrificial silicon germanium layer over the capping layer and forming a sacrificial silicon layer over said sacrificial silicon germanium layer prior to forming the base contact layer.

7. The method of claim 6, wherein at least one of said sacrificial layers comprises an impurity.

8. The method of claim 1, wherein the step of forming said base layer comprises epitaxially growing:
    a first undoped Si layer over the substrate;
    an undoped SiGe:C collector-base spacer on the first undoped Si layer;
    a boron-doped SiGe:C base on the collector-base spacer; and
    a SiGe:C base-emitter spacer on the base.

* * * * *